(12) United States Patent
Alley et al.

(10) Patent No.: US 9,709,605 B2
(45) Date of Patent: Jul. 18, 2017

(54) SCROLLING MEASUREMENT DISPLAY TICKER FOR TEST AND MEASUREMENT INSTRUMENTS

(71) Applicant: Tektronix, Inc., Beaverton, OR (US)

(72) Inventors: James D. Alley, Newberg, OR (US); Tyler B. Niles, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1182 days.

(21) Appl. No.: 13/712,954

(22) Filed: Dec. 12, 2012

(65) Prior Publication Data

US 2014/0163914 A1   Jun. 12, 2014

(51) Int. Cl.
   *G01R 13/02*   (2006.01)
(52) U.S. Cl.
   CPC ........... *G01R 13/02* (2013.01); *G01R 13/029* (2013.01)
(58) Field of Classification Search
   CPC ...... G01R 13/02; G01R 13/029; G01R 13/00; G01R 13/20; G01R 13/0209; G06F 3/048
   See application file for complete search history.

(56) References Cited

U.S. PATENT DOCUMENTS

2005/0246115 A1*  11/2005  Sakurai ................ G01R 13/029
                                                               702/67
2007/0035658 A1    2/2007  Ketterer et al.
2007/0135946 A1    6/2007  Sugiyama et al.
2007/0273694 A1   11/2007  Dobyns et al.
2008/0263472 A1*  10/2008  Thukral ................ G06F 3/0482
                                                               715/774
2010/0194755 A1    8/2010  Foo et al.

FOREIGN PATENT DOCUMENTS

DE       102006058828 A1    6/2008

OTHER PUBLICATIONS

European Search Report and Written Opinion for Application No. 13193139.6, dated Mar. 31, 2014, 7 pages.

* cited by examiner

*Primary Examiner* — Manuel L Barbee
(74) *Attorney, Agent, or Firm* — Michael A. Nelson; Kevin D. Dothager; Marger Johnson

(57) ABSTRACT

A test and measurement instrument configured to receive at least one input signal is disclosed. The test and measurement instrument includes a processor configured to sample the input signal and generate a plurality of measurements. The processor is configured to generate a measurement ticker having a plurality of ticker elements configured for presentation on a display in a serial, scrolling fashion. Each ticker element has a measurement value associated with the input signal. The processor may be configured to sample a plurality of input signals and each ticker element may include a measurement value associated with at least one of the plurality of input signals. Each ticker element may further comprise a source ID and a measurement type.

21 Claims, 8 Drawing Sheets

SCROLLING MEASUREMENT DISPLAY TICKER FOR TEST AND MEASUREMENT INSTRUMENTS

FIELD OF INVENTION

This invention relates to the field of test and measurement instruments and in particular improved measurement displays for such devices.

BACKGROUND

Modern digital oscilloscopes generally provide the capability to generate a waveform of a given input signal. Such test and measurement instruments are equipped with triggering hardware and software that is configurable to capture a desired event. Many oscilloscopes have the ability to display waveform measurement of the acquired waveforms. However as numerous measurements are added, they begin to take up significant screen space and can block the user's view of important waveform information. Accordingly, there exists a need to provide improved measurement display capabilities that provide increased measurement viewing capabilities for such test and measurement instruments.

SUMMARY OF THE INVENTION

A test and measurement instrument configured to receive at least one input signal is disclosed. The test and measurement instrument includes a processor configured to sample the input signal and generate a plurality of measurements. The processor is configured to generate a measurement ticker having a plurality of ticker elements configured for presentation on a display in a serial, scrolling fashion. Each ticker element has a measurement value associated with the input signal.

The processor may be configured to sample a plurality of input signals and each ticker element may include a measurement value associated with at least one of the plurality of input signals. Each ticker element may further comprise a source ID and a measurement type. Each ticker element may further comprise a measurement ID. The source ID may identify a channel number associated with the input signal. The measurement type may include at least one of the following: frequency, peak to peak amplitude, period and root mean square (RMS) magnitude. The measurement ID may include descriptive information about the measurement including at least one of the following: min, max, mean and standard deviation. The measurement value may include unit information.

The test and measurement instrument may also include a user interface configured to receive a user input and adjust a format associated with the measurement ticker. The user interface may be configured to add ticker elements, delete ticker elements, edit ticker elements and start and stop the measurement ticker.

A method of providing a measurement display on a test and measurement instrument configured to receive at least one input signal is also disclosed. The method includes sampling the input signal and generating a plurality of measurements. A measurement ticker is generated with a plurality of ticker elements configured for presentation on a display in a serial, scrolling fashion. Each ticker element has a measurement value associated with the input signal.

The method of may include sampling a plurality of input signals, wherein each ticker element includes a measurement value associated with at least one of the plurality of input signals. Each ticker element may further comprise a source ID and a measurement type. Each ticker element may further comprise a measurement ID. The source ID may identify a channel number associated with the input signal. The measurement type may include at least one of the following: frequency, peak to peak amplitude, period and root mean square (RMS) magnitude. The measurement ID may include descriptive information about the measurement including at least one of the following: min, max, mean and standard deviation. The measurement value may include unit information.

The method may also include receiving a user input and adjusting a format associated with the measurement ticker. The method may also include performing at least one of the following based on the user input: adding a ticker element, deleting a ticker element, editing a ticker element and starting and stopping the measurement ticker.

A computer readable medium having stored thereon a computer program for execution by a processor configured to perform a method of providing a measurement display on a test and measurement instrument configured to receive at least one input signal is also disclosed. The method includes sampling the input signal and generating a plurality of measurements. A measurement ticker is generated with a plurality of ticker elements configured for presentation on a display in a serial, scrolling fashion. Each ticker element has a measurement value associated with the input signal.

DETAILED DESCRIPTION OF THE INVENTION

Many oscilloscopes have the ability to display waveform measurement of the acquired waveforms. However as numerous measurements are added, they begin to take up significant screen space and can block the user's view of important waveform information. To solve this problem a scrolling measurement display (ticker) is used instead of a stacked measurement output (FIG. 1b).

Figure 1A:
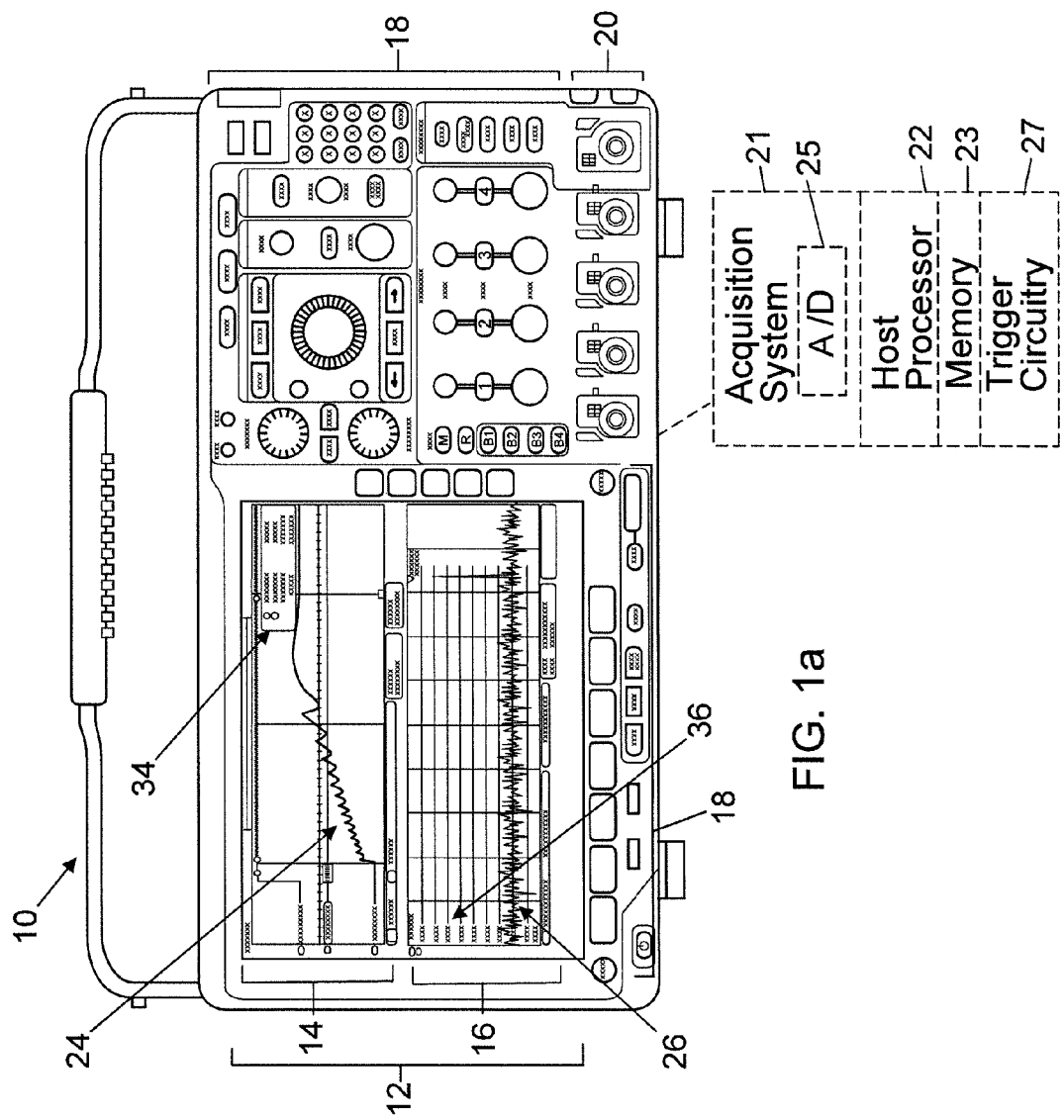
FIG. 1a is a diagram of an oscilloscope having a typical display.
Figure 1B:
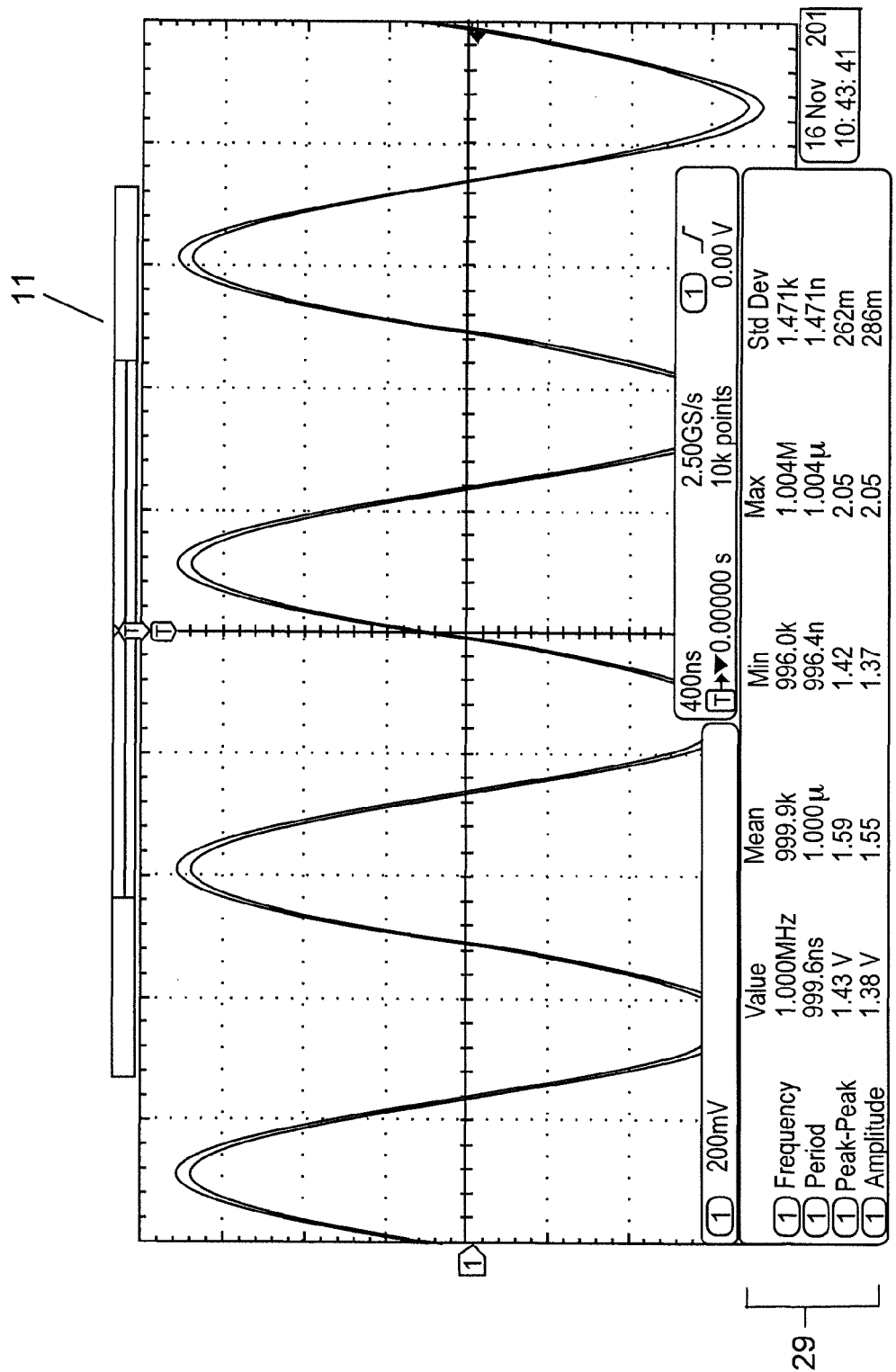
FIG. 1b is a diagram of an oscilloscope having a stacked measurement display.

FIG. 1a is a diagram of a test and measurement instrument (oscilloscope) 10 having a display 12 that may be divided into a plurality of display areas 14, 16. The display 12 is configured to graphically display at least one waveform 24, 26 and other graphical indicia 34, 36 for example alpha numeric text including measurement information. The oscilloscope 10 also has a plurality of user controls 18 configured for user input and a plurality of electrical inputs 20 configured to receive test signals and the like.

In this example, the oscilloscope 10 is implemented as a stand-alone unit with an acquisition system 21, a processor 22 and a memory 23 configured for storage of program information and data. It should be understood that processor 22 may be coupled to additional circuitry, e.g., I/O, graphics generation hardware and the like. The processor 22 is configured to receive data from at least a portion of the inputs as selected via the user controls 18. Analog to digital (A/D) converter 25 is configured to digitize signals received from the electrical inputs 20. Trigger circuitry (trigger system) 27 provides timing signals for controlling the acquisition process as discussed below. A variety of triggering modes is disclosed in U.S. Pat. No. 7,191,079 which is incorporated herein in its entirety.

The processor 22 is also configured to generate at least a portion of the information presented by display 12. It should be understood that the oscilloscope may be implemented using a variety of hardware and software including embodiments implemented using computing devices, e.g., desktop, laptop, tablet, smart phone or other computing devices, and that some of these systems may or may not provide or require a display device. A digitizer is an example of a system without an associated display.

Figure 2:
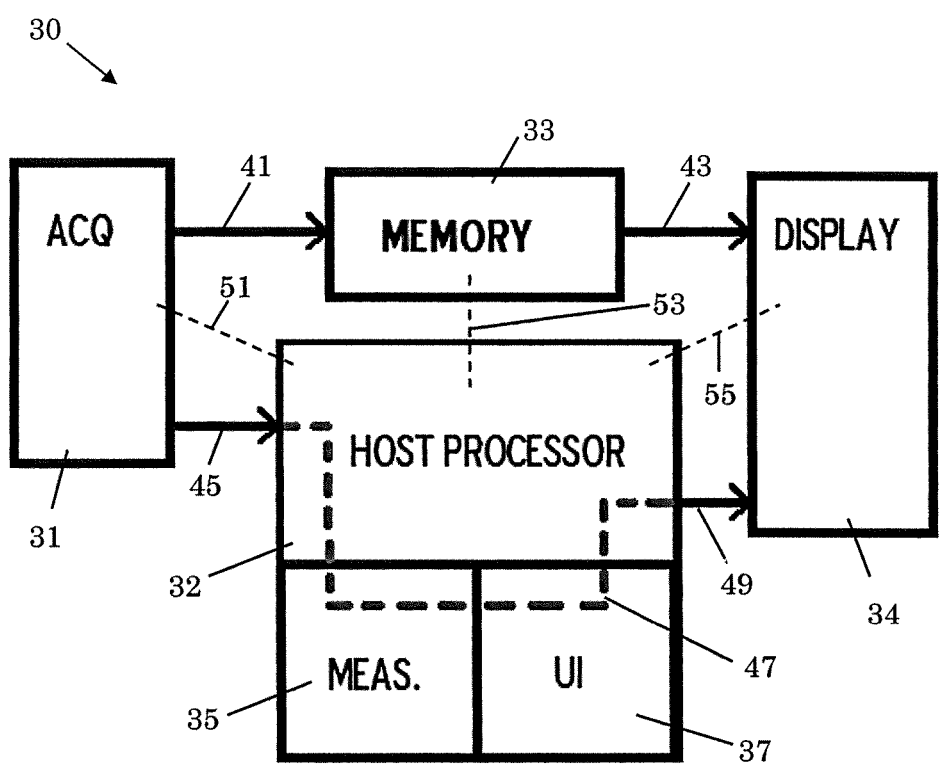
FIG. 2 is a block diagram of a test and measurement instrument that may be configured to generate and display a measurement ticker in a serial, scrolling fashion.

FIG. 2 is a block diagram of a test and measurement instrument 30 that may be configured to generate and display a measurement ticker in a serial, scrolling fashion. This is an improvement over traditional measurement display format such as a stacked measurement output 29 as shown on sample display 11 shown in FIG. 1b. Using such display formats often causes at least a portion of displayed waveforms to be obfuscated by the measurement display. Under such circumstances, the user may be required to turn off the stacked measurement display in order to see all of the waveform information.

Returning to FIG. 2, the test and measurement instrument 30 includes a host processor 32 coupled to acquisition circuitry 31, memory 33 and a display 34 as generally shown by dashed lines 51, 53 and 55. The host processor 32 is also coupled to a measurement module 35 and user interface module 37. It should be understood that measurement module 35 and user interface module 37 may include both hardware coupled to the host processor 32 and software that may be configured to run on host processor 32. Lines 41 and 43 generally illustrate the flow of data from the acquisition circuitry 31 to memory 33 and ultimately to the display 43. This path is generally intended to illustrate the acquisition and display of waveform information, e.g., waveforms 24 and 26 shown in FIG. 1a.

In FIG. 2, lines 45, 47 and 49 general illustrate the flow of data from the acquisition circuitry 31 through the host processor 32 and ultimately to the display 43. This path is generally intended to illustrate the acquisition, generation and display of measurement information and other indicia, e.g., graphical indicia 34, 36 shown in FIG. 1a. The measurement module 35 is generally configured to generate measurements based on the acquired data. The user interface module 37 is generally configured to allow the user to control display operations including the selection and general format of measurement information for subsequent display.

Figure 3:
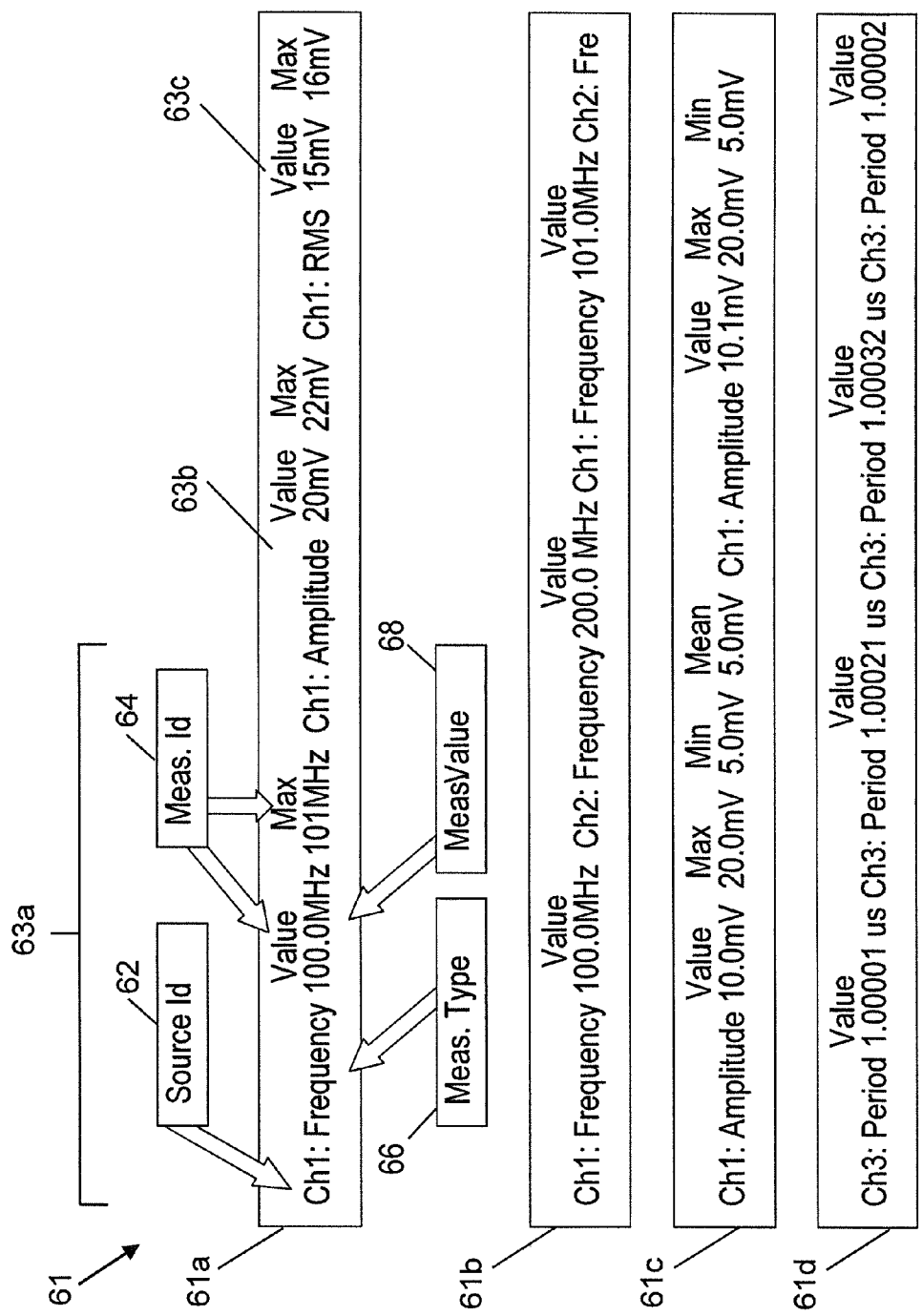
FIG. 3 is a block diagram of a measurement ticker.

FIG. 3 is a block diagram of a measurement ticker 61 broken down into portions 61a, 61b, 61c and 61d. Portions 61a, 61b, 61c and 61d may be generally understood as snapshots of a measurement ticker at different points in time. It should be understood that the measurement ticker 61 may be located anywhere on a display associated with a test and measurement instrument.

The measurement ticker 61 includes a plurality of ticker elements, e.g., 63a-63c, that are displayed in a serial, scrolling fashion. It should also be understood that once all ticker elements have been displayed and scrolled off a display they may be re-displayed in a repetitive loop fashion. Each ticker element may include a source ID 62, measurement ID 64, measurement type 66 and at least one measurement value 68. The source ID 62 may identify a particular channel of the test and measurement instrument from which the measurement was taken. The measurement type 66 may generally describe the type of measurement, e.g., frequency, peak to peak amplitude, period, root mean square (RMS) magnitude as shown in the various figures disclosed herein. It should be understood that a wide variety of measurement types may be used without departing from the scope of this disclosure including but not limited to: frequency, period, rise time, fall time, delay, phase, positive pulse width, negative pulse width, positive duty cycle, negative duty cycle, burst width, peak-to-peak (voltage), amplitude, max, min, high, low, positive overshoot, negative overshoot, rising edge count, falling edge, count, area and cycle area. The measurement ID 64 may generally provide further descriptive information about the measurement, e.g., min, max, standard deviation or other label information. The measurement value 68 may generally provide measurement results, typically numeric information, and may also include unit information. For example in ticker element 63a two measurement values are included, a current value of 100.0 MHz and a max value (historic information) of 101 MHz. In ticker element 63c two measurement values are included, a current value of 20 mv and a max value (historic information) of 22 mv. In ticker element 63b two measurement values are also included, a current value of 15 mv and a max value (historic information) of 16 mv.

Figure 4:
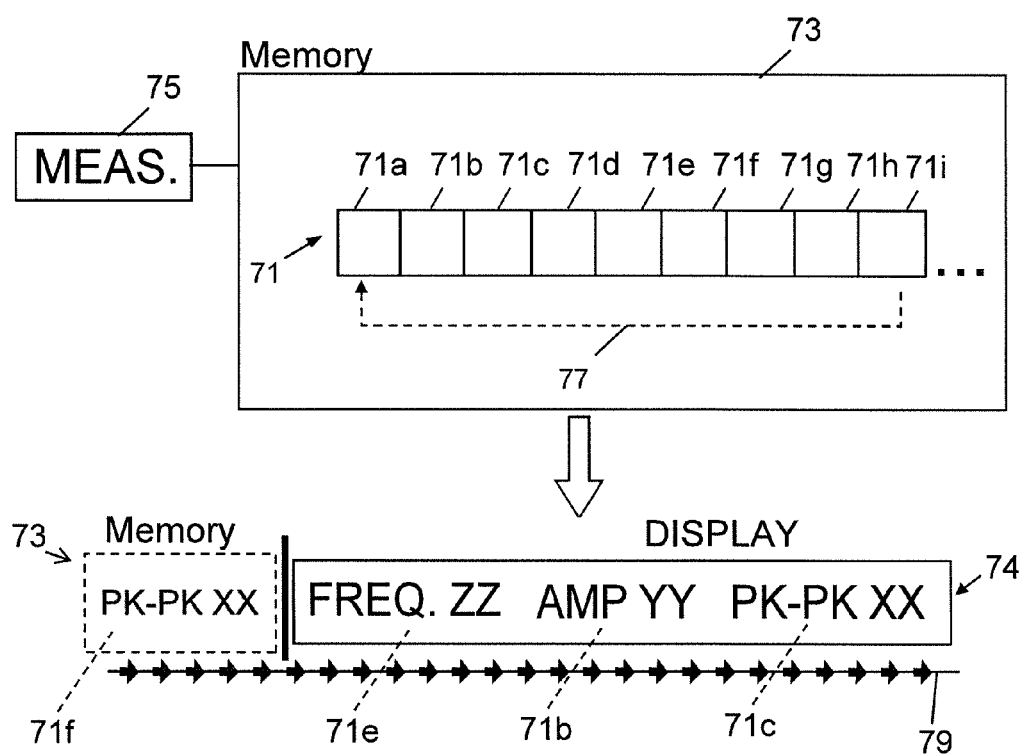
FIG. 4 is a block diagram showing the flow of measurement information from the measurement module to the display.

FIG. 4 is a block diagram showing the flow of measurement information from the measurement module 75 to the measurement ticker 74 via memory 73. The measurement module 75 (see also reference number 35 in FIG. 2) is generally configured to generate measurements based on the acquired data. The user interface module 37 (FIG. 2) is generally configured to allow the user to control display operations including the selection and general format of measurement information for subsequent display. In this example, the user has selected 9 different ticker elements shown generally stored in memory locations 71a-71i for subsequent display. Arrow 77 is generally intended to show that once all 9 ticker elements are displayed, the display process may be repeated. It should be understood that fewer or additional memory locations may be allocated depending on the number of ticker elements selected by the user. In this example, measurement ticker 74 generally shows the ticker elements 71e, 71b, and 71c presented in a serial, scrolling fashion as represented by arrow 79. A portion of memory 73 is shown with ticker element 71f ready for display.

Figure 5:
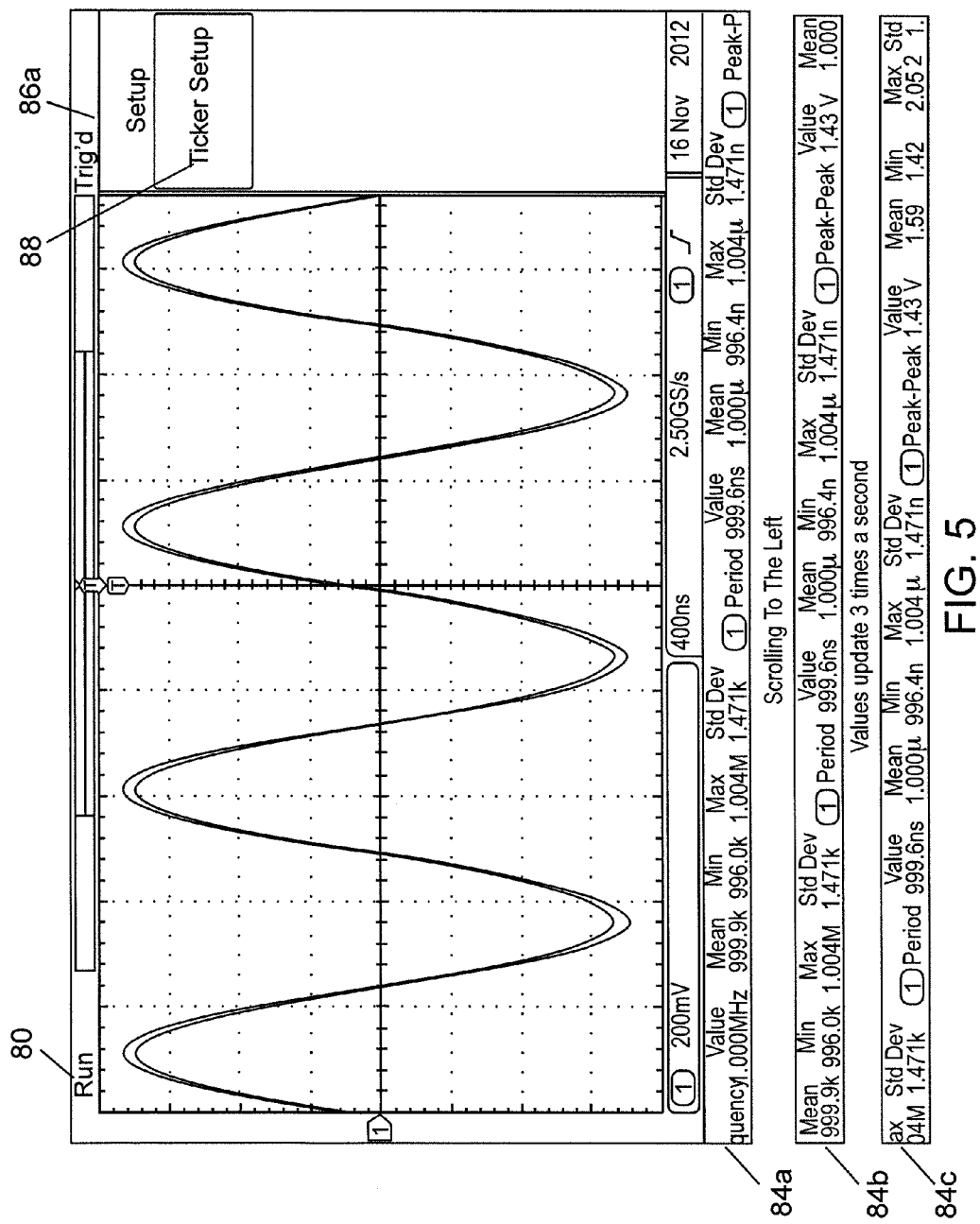
FIG. 5 is a diagram of a display with a measurement ticker positioned along the lower edge of the display.

FIG. 5 is a diagram of a display 80 with a measurement ticker 84a positioned along the lower edge of the display. In this example, the measurement ticker scrolls from left to right as illustrated by reference numbers 84b and 84c. It should be understood that ticker element values may be updated after certain time intervals or after specific events. In this example the ticker element values are updated 3 times per second.

FIG. 5 also shows a portion of a user interface, namely setup window 86a. The setup window includes a ticker setup button 88 that may be selected in order to configure the measurement ticker. It should be understood that the user interface may use a variety of display techniques and input methods as is well known to those skilled in the art in order to allow a user to configure the measurement ticker.

Figure 6:
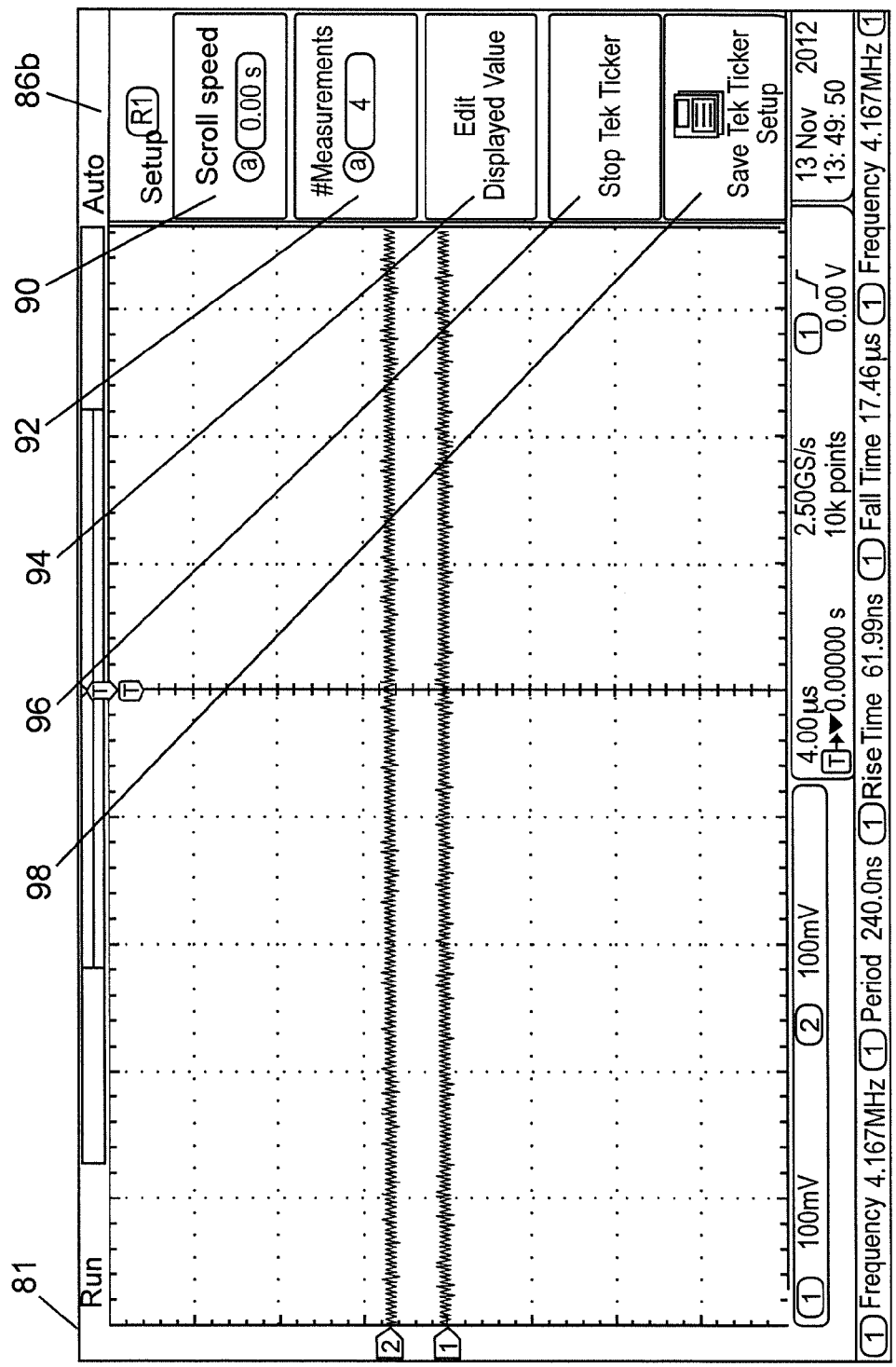
FIG. 6 is a diagram of a display with a setup window.

FIG. 6 is a diagram of a display 81 configured with a setup window 86b. In this example, the setup window 86b includes button/input portions configured to select the scroll speed 90 and the number of ticker elements (measurements) 92. The setup window 86b also includes a start/stop button 96 which may be generally configured to control whether or not the measurement ticker is displayed. The setup window 86b also includes a save button 98 that may be used to save the current measurement ticker configuration. Edit button 94 may be used to gain access to the various button/input portions e.g., 90 and 92. It should be understood that a wide variety of selection mechanisms e.g., touch screen, graphical pointers, select and scroll buttons may be provided such that the user may select the desired ticker elements and generally configure the measurement ticker as is well known in the art.

Figure 7:
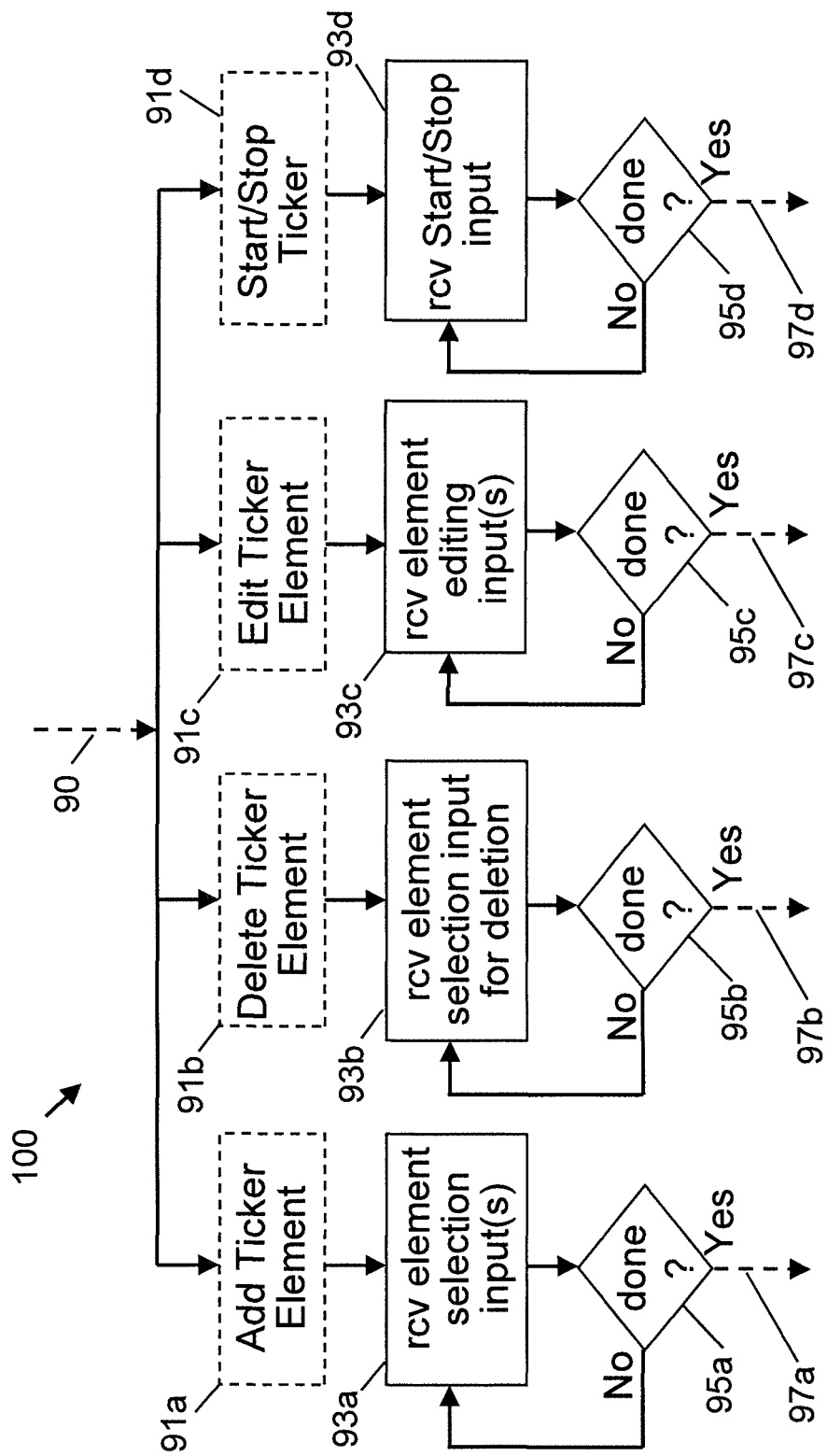
FIG. 7 is a flow chart generally showing basic user interface functionality.

FIG. 7 is a flow chart 100 generally showing the general processing steps to carry out basic user interface functionality. It should be understood that any flowcharts contained herein are illustrative only and that other program entry and exit points, time out functions, error checking routines and the like (not shown) would normally be implemented in typical system software. It is also understood that system software may run continuously after being launched. Accordingly, any beginning and ending points, e.g., reference numbers 90 and 97a-97d, are intended to indicate logical beginning and ending points of a portion of code that can be executed as needed. The order of execution of any of the blocks may also be varied without departing from the scope of this disclosure. Implementation of these aspects is readily apparent and well within the grasp of those skilled in the art based on the disclosure herein.

Processing generally begins when the user selects one of the following functions: add ticker element, delete ticker element, edit ticker element and start/stop ticker as generally shown by blocks 91a-91d. The add ticker element function generally includes receiving ticker element information, e.g., select measurement type, channel and the like, as shown by block 93a. It should be understood that suitable memory location(s) may be allocated as generally shown in FIG. 4. The process may be repeated until all desired ticker elements are added as shown generally by block 95a. The delete ticker element function generally includes receiving ticker element deletion information as shown by block 93b. It should be understood that associated memory location(s), e.g., as shown in FIG. 4, may be de-allocated. The process may be repeated until all desired ticker elements are deleted as shown generally by block 95b.

The edit ticker element function generally includes receiving ticker editing information, e.g., change measurement type, channel and the like, as shown by block 93c. It should be understood that associated memory location(s), e.g., as shown in FIG. 4, may be re-allocated or otherwise adjusted as needed. The process may be repeated until all desired ticker elements are edited as shown generally by block 95c. The Start/Stop ticker function generally includes receiving ticker start/stop input information as shown by block 93d. It should be understood that aside from start/stop information the user may perform other functions such as save the current configuration and clear all current ticker elements. Accordingly, memory location(s), e.g., as shown in FIG. 4, may be allocated, de-allocated, updated or otherwise adjusted as needed. The process may be repeated until all start/stop information is received as shown by block 95d.

It should be understood that many variations are possible based on the disclosure herein. Although features and elements are described above in particular combinations, each feature or element can be used alone without the other features and elements or in various combinations with or without other features and elements. The apparatus or methods disclosed herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A test and measurement instrument comprising:
   an input configured to receive an input signal; and
   a processor configured to:
      sample the input signal,
      generate a plurality of measurements at least a subset of which are based on the samples of the input signal, and
      generate a measurement ticker having a plurality of ticker elements configured for presentation on a display in a serial, scrolling fashion such that the plurality of ticker elements are cyclically scrolled off the display and displayed again, each ticker element having a measurement value associated with at least one of the plurality of measurements, wherein the measurement value of at least one of the plurality of ticker elements is a present measurement value of the input signal and is dynamically updated over time.

2. The test and measurement instrument of claim 1, further comprising:
   one or more additional inputs configured to receive one or more additional input signals, wherein:
      the processor is configured to sample the one or more additional input signals,
      an additional subset of the plurality of measurements are based on the samples of the one or more additional input signals, and
      at least one ticker element includes a measurement value associated with the additional subset of the plurality of measurements.

3. The test and measurement instrument of claim 1, wherein each ticker element further comprises:
   a source ID that identifies information concerning a source of the input signal; and
   a measurement type that identifies information concerning a type associated with the measurement value of the ticker element, and wherein the measurement type of at least one of the ticker elements includes one or more of the following: frequency, peak to peak amplitude, period and root mean square (RMS) magnitude.

4. The test and measurement instrument of claim 3, wherein each ticker element further comprises a measurement ID that describes the measurement value of the ticker element.

5. The test and measurement instrument of claim 4, wherein the at least one of the plurality of ticker elements includes a historical measurement value in addition to the present measurement value.

6. The test and measurement instrument of claim 5, wherein the historical measurement value is a min, max, mean, or standard deviation of previously recorded present measurement values of the at least one of the plurality of ticker elements.

7. The test and measurement instrument of claim 3, wherein a measurement type of a first ticker element, of the plurality of ticker elements, is different than a measurement type of a second ticker element, of the plurality of ticker elements.

8. The test and measurement instrument of claim 1, further comprising a user interface configured to receive a user input to adjust a format associated with the measurement ticker by enabling the user to add ticker elements to the measurement ticker, delete ticker elements from the measurement ticker, edit ticker elements of the measurement ticker, and start and stop the measurement ticker.

9. The test and measurement instrument of claim 8, wherein to edit ticker elements the user interface is further configured to:
 receive user input selecting a ticker element, of the plurality of ticker elements;
 receive user input changing a measurement type of the selected ticker element; and
 update the selected ticker element in accordance with the different measurement type.

10. A method of providing a measurement display on a test and measurement instrument, the method comprising:
 receiving an input signal;
 sampling the input signal;
 generating a plurality of measurements at least a subset of which are based on the samples of the input signal;
 generating a measurement ticker having a plurality of ticker elements configured for presentation on a display in a serial, scrolling fashion such that the plurality of ticker elements are automatically cyclically scrolled off the display and displayed again, each ticker element having a measurement value associated with at least one of the plurality of measurements, wherein the measurement value of at least one of the plurality of ticker elements is a present measurement value of the input signal that is dynamically updated over time.

11. The method of claim 10, further comprising:
 receiving one or more additional input signals,
 sampling the one or more additional input signals, wherein:
  an additional subset of the plurality of measurements are based on the samples of the one or more additional input signals, and
  at least one ticker element includes a measurement value associated with the additional subset of the plurality of measurements.

12. The method of claim 10, wherein each ticker element further comprises:
 a source ID that identifies information concerning a source of the input signal; and
 a measurement type that identifies information concerning a type associated with the measurement value of the ticker element, and wherein the measurement type of at least one of the ticker elements includes one or more of the following: frequency, peak to peak amplitude, period and root mean square (RMS) magnitude.

13. The method of claim 12, wherein each ticker element further comprises a measurement ID that describes the measurement value of the ticker element.

14. The method of claim 13, wherein the at least one of the plurality of ticker elements includes a historical measurement value in addition to the present measurement value.

15. The method of claim 14, wherein the historical measurement value is a min, max, mean, or standard deviation of previously recorded present measurement values of the at least one of the plurality of ticker elements.

16. The method of claim 12, wherein a measurement type of a first ticker element, of the plurality of ticker elements, is different than a measurement type of a second ticker element, of the plurality of ticker elements.

17. The method of claim 10, further comprising:
 receiving a user input to adjust a format of the measurement ticker; and
 in response to the user input, enabling a user to add ticker elements to the measurement ticker, delete ticker elements from the measurement ticker, edit ticker elements of the measurement ticker, and start and stop the measurement ticker.

18. The method of claim 17, wherein to edit ticker elements the method further comprises:
 receiving user input selecting a ticker element, of the plurality of ticker elements;
 receiving user input changing a measurement type of the selected ticker element to a different measurement type; and
 updating the selected ticker element in accordance with the different measurement type.

19. A non-transitory computer readable medium having stored thereon a computer program for execution by a processor of a test and measurement instrument, which, when executed by the processor cause the test and measurement instrument to:
 receive an input signal;
 sample the input signal;
 generate a plurality of measurements based on the samples of the input signal; and
 generate a measurement ticker having a plurality of ticker elements configured for presentation on a display in a serial, scrolling fashion such that the plurality of ticker elements are cyclically scrolled off the display and displayed again, each ticker element having a measurement value associated with at least one of the plurality of measurements, wherein the measurement value of at least one of the plurality of ticker elements is a present measurement value of the input signal that is dynamically updated over time.

20. The non-transitory computer readable medium of claim 19, wherein the at least one of the plurality of ticker elements includes a historical measurement value in addition to the present measurement value, and wherein the historical measurement value is based on previously recorded present measurement values that are not included within the measurement ticker.

21. The non-transitory computer readable medium of claim 19, wherein the instructions, when executed by the processor, further cause the processor to:
 receive user input selecting a ticker element, of the plurality of ticker elements;

receive user input changing a measurement type of the selected ticker element to a different measurement type; and update the selected ticker element in accordance with the different measurement type.

\* \* \* \* \*